United States Patent
Serban et al.

(10) Patent No.: US 8,542,203 B2
(45) Date of Patent: Sep. 24, 2013

(54) TOUCHPAD WITH STRIP-SHAPED INPUT AREA

(75) Inventors: Bogdan Serban, Leudelange (LU); Philippe Boyer, Boust (FR); David Hoyer, Ayl (DE)

(73) Assignee: IEE International Electronics & Engineering S.A., Luxembourg (LU)

(*) Notice: Subject to any disclaimer, the term of this patent is extended or adjusted under 35 U.S.C. 154(b) by 676 days.

(21) Appl. No.: 12/672,831

(22) PCT Filed: Jul. 29, 2008

(86) PCT No.: PCT/EP2008/059903
§ 371 (c)(1), (2), (4) Date: May 5, 2010

(87) PCT Pub. No.: WO2009/021836
PCT Pub. Date: Feb. 19, 2009

(65) Prior Publication Data
US 2011/0267300 A1 Nov. 3, 2011

(30) Foreign Application Priority Data
Aug. 10, 2007 (EP) .................................. 07114195

(51) Int. Cl.
*G09G 3/36* (2006.01)
(52) U.S. Cl.
USPC ........... 345/173; 345/158; 345/175; 345/179; 178/18.01
(58) Field of Classification Search
USPC ......... 345/173, 175, 156–158, 179; 340/365; 178/18.01; 338/99
See application file for complete search history.

(56) References Cited

U.S. PATENT DOCUMENTS

| 4,264,903 | A  | 4/1981  | Bigelow        |
|-----------|----|---------|----------------|
| 5,907,327 | A  | 5/1999  | Ogura          |
| 6,424,338 | B1 | 7/2002  | Anderson       |
| 2001/0013855 | A1 | 8/2001 | Fricker       |
| 2004/0037051 | A1 | 2/2004 | Hagiwara et al. |
| 2005/0052429 | A1 | 3/2005 | Philipp       |
| 2006/0232559 | A1 | 10/2006 | Chein         |
| 2007/0176903 | A1 | 8/2007 | Dahlin        |

FOREIGN PATENT DOCUMENTS

| EP | 1811364 A2     | 7/2007 |
| WO | 2006071799 A2  | 7/2006 |

OTHER PUBLICATIONS

International Search Report; PCT/EP2008/059903; Dated Sep. 25, 2008.

*Primary Examiner* — Lun-Yi Lao
*Assistant Examiner* — Shaheda Abdin
(74) *Attorney, Agent, or Firm* — Cantor Colburn LLP

(57) ABSTRACT

A touchpad with an input area having a straight or curved main line of extension comprises a support element, a cover having a first surface facing away from the support element and a second surface facing towards the support element and one or more spacers arranged at a periphery of the input area. The one or more spacers mount the cover on the support element in such a way that the cover spans over the support plate in the input area while it is depressible towards the support element by a force acting on the input area of the touchpad. A resistive trace is so arranged on the support element that it extends along the main line of extension of the input area. At least one terminal contacts the resistive trace at a particular point of the main line of extension of the input area and a set of detection electrodes is arranged on the second surface of the cover in facing relationship with the resistive trace. The detection electrodes are configured and arranged for capacitively detecting a position of a user's finger or stylus when the user's finger or stylus is in proximity of or in light touch with the first surface of the cover, and for resistively detecting a position of a user's finger or stylus when the user's finger or stylus depresses the cover and so brings at least one of the detection electrodes into electrical contact with the resistive trace.

13 Claims, 8 Drawing Sheets

User input     "Capacitive" position     "Resistive" position     Output on display User input     "Capacitive" position     "Resistive" position     Output on display

TOUCHPAD WITH STRIP-SHAPED INPUT AREA

TECHNICAL FIELD

The present invention generally relates to a touchpad having a strip-shaped input area, i.e. an input area having a straight or curved main line of extension whose width orthogonal to this main line of extension is comparably small.

BACKGROUND

Input devices, in particular capacitive input devices, with strip-shaped input areas are well known in the technical field, e.g. from document U.S. Pat. No. 4,264,903. The latter discloses a strip-shaped capacitive touchpad, comprising a solid panel having a front surface facing an operator of the touchpad and a rear surface facing away from the operator, a plurality of detection electrodes disposed along a predefined geometric curve (e.g. a straight line or an annular curve) and applied to the rear surface of the panel. The emplacement of the operator's finger on the front surface of the panel at a point upon the detection electrode pattern causes an additional capacitance between a pair of adjacent detection electrodes or one detection electrode and ground, which can be measured and which the position of the operator's finger can be derived from. The detection electrodes are shown as being interdigitated with the respective neighbouring detection electrode or detection electrodes.

To move a cursor (also referred to as a pointer) or another visual indicator on a display screen associated to a touchpad, the user puts his or her finger on the operating surface (the surface corresponding to the input area of the touchpad, which is, in the above example on the front surface of the panel) and then slides the finger while keeping it in light touch with the operating surface. In laptop computers and other electronic appliances, touchpads are often associated with one or more buttons, which provide mouse-click functionality, e.g. for selecting a displayed object currently highlighted or pointed at on the display, drag-dropping a displayed object (by positioning the cursor or visual indicator on the object to be dragged, pressing the button and keeping the button pressed while moving the cursor to the desired location, then releasing the button for "dropping" the object), etc. The disadvantage of separate buttons is that the user needs both his or her hands to access the mouse-click functionality. Indeed, the user usually depresses the button with the forefinger of one hand while moving the cursor with the forefinger or the middle finger of the other hand.

In certain touchpads, such mouse-click functionality can also be emulated by tapping the operating surface with the finger. Document U.S. Pat. No. 5,907,327 describes that touchpads with such "tapping" function, make it possible with one finger to perform not only the above-mentioned "single-click" operations (selecting, dragging, etc.) but also "double-click" operations (opening a folder, starting an application, etc.). Dragging can be carried out on a touchpad by first putting the cursor upon the displayed object to be dragged (e.g. an icon or window), then tapping the input area surface once, placing the finger on the input area surface immediately after the tapping and sliding the finger on the surface, thereby causing the cursor to move on the screen. Some touchpads even provide for the so-called drag-lock functionality, so that the finger may be lifted from the input area surface (e.g. when reaching the border of the input area) without causing the touchpad to leave the dragging mode. The touchpad may, in particular, be configured to go into drag-lock mode if the user's finger has been moved a predefined minimum distance after the touchpad had been placed into dragging mode.

While some people have no difficulty in using the tapping functionality provided by touchpads, others deliberately switch it off (if this is possible and if they know how this can be done) and work with the associated buttons or keys because they otherwise would often unintentionally trigger the tapping functionality. Accordingly, there is still room for making touchpads user-friendlier. In this regard, differentiation between intentional and unintentional user action is of particular concern.

Document U.S. Pat. No. 6,424,338 mentions that mouse-clicks can be implemented by a switch responsive to downward pressure, positioned underneath a touch pad surface. Document US 2006/0232559 A1 discloses a capacitive touchpad with a physical key function, comprising a soft flexible first conductive layer, a second conductive layer and a soft flexible insulator layer disposed between the first and second conductive layers. The insulator layer has holes therein for the first conductive layer to connect to the second conductive layer while the touchpad is pressed and to thus trigger a predetermined key function.

BRIEF SUMMARY

The invention provides a user-friendlier touchpad, in which the above-mentioned drawbacks are reduced or eliminated.

A touchpad comprises a support element (e.g. a board, a plate, a sheet or a film), a cover (e.g. a board, a plate, a sheet or a film) having a first surface facing away from the support element and a second surface facing towards the support element. The cover is mounted in spaced relationship with respect to the support element in such a way that it spans over the support element in the input area while being depressible towards the support element by a force acting on the input area of the touchpad. According to the invention, a resistive trace is so arranged on the support element that it extends along the main line of extension of the input area and at least one terminal contacts the resistive trace at a particular point of the main line of extension of the input area. A set of detection electrodes (preferably detection electrodes having a resistivity of not more than 2 kΩ/square) is arranged on the second surface of the cover in facing relationship with the resistive trace (having a resistivity of preferably not more than 100 kΩ/square, more preferably not more than 10 kΩ/square, and still more preferably between 2 and 10 kΩ/square). The detection electrodes are configured and arranged, e.g. individually connectable to an evaluation circuit, for capacitively detecting a position of a user's finger or stylus when the user's finger or stylus is in proximity of or in light touch with the first surface of the cover, and for resistively detecting a position of a user's finger or stylus when the user's finger or stylus depresses the cover and so
brings at least one of the detection electrodes into electrical contact with the resistive trace. Those skilled will note that if the user uses a stylus to operate the touchpad, the tip of the stylus has to be configured such that it capacitively couples to the detection electrodes. This is the case, for instance, for a conductive stylus (e.g. a metal stylus). As it will be apparent for those skilled in the art, the support element preferably comprises an insulating, mechanically substantially rigid plate or a combination of a mechanically substantially rigid base plate and an insulating sheet or film on the side of the base plate facing the cover.

Those skilled will appreciate that the function of the detection electrodes on the second surface of the cover is twofold. On the one hand, when the cover is not depressed, the detection electrodes are electrically isolated from the resistive trace and they may be used for detecting the position of the user's finger or stylus by suitable capacitance measurements or by measurements of any quantity from which the capacitance could be derived. On the other hand, when the user depresses the cover with sufficient force, some (or all, depending on the configuration) of the detection electrodes are put into electrical contact with the resistive trace. The position of the user's finger can thus be determined e.g. by applying a potential gradient through the resistive trace and detecting the voltage resulting on the detection electrodes on the cover, or by measuring the resistance between a terminal contacting the resistive trace and the detection electrodes.

The touchpad according to the invention may therefore be operated in two different ways and thus unites two input devices in a single one. Different actions may result from operating the touchpad, depending on whether the user's finger or stylus touches the operating surface lightly (i.e. without causing the cover to be pressed onto the support element) or hardly (i.e. so as to cause the cover to be pressed onto the support element). Nevertheless, the present invention eliminates the need for providing separate detection electrodes for the capacitive measurement and the resistive measurement, which leads to a simplified touchpad structure and saves production costs.

It shall be noted that a great variety of methods of capacitive measurement is known in the art. The most common ones of these methods include current-versus-voltage phase shift measurement, charging time measurement, the so-called charge transfer technique (wherein the capacitor being sensed is cyclically switched to a voltage source and to a summing capacitor, so that the charge on the summing capacitor increases with each cycle, and wherein the number of cycles or the time necessary to reach a predefined charge or voltage on the summing capacitor is determined), the so-called relaxation oscillator method (wherein the capacitor being sensed is connected to a current source so that the voltage on the capacitor increases with time, the voltage of the capacitor is fed to a comparator, which goes high for a time period having a certain minimum duration and closes a switch which resets the capacitor voltage to ground; the frequency of the peaks in the comparator output indicates the capacitance), and many more. Detection circuits for measuring capacitance are commercially available, e.g. from Cypress, Quantum Research Group, etc.

The touchpad of the present invention is preferably a one-dimensional touchpad, in the sense that the touchpad preferably detects only the position of the user's finger or stylus on the main line of extension of the input area while it does not detect the offset of the user's finger or stylus perpendicular from the main line of extension. Those skilled will note, however, that by suitably arranging the detection electrodes and providing additional terminals contacting the resistive trace, the touchpad could be carried out as a two-dimensional touchpad, in the sense that such a touchpad detects not only the position of the user's finger or stylus on the main line of extension of the input area but also the offset of the user's finger or stylus perpendicular from the main line of extension. Alternatively, a plurality of one-dimensional touchpads capable of sensing the position in a first direction could be arranged adjacent to one another in a second direction perpendicular to the first direction.

The resistive trace of the touchpad may be provided as a continuous resistive strip or, alternatively, as an arrangement of serially interconnected resistive spots or patches. If the resistive trace is a continuous strip, the outputted position of the finger or stylus may vary continuously; if, however, the resistive trace comprises several resistive spots or patches, there is some quantization of the output position as a function of the true position of the finger or stylus. Preferably, the density of such serially interconnected resistive spots or patches is chosen sufficiently high to avoid jumps in the output position when the true position is continuously varied. Preferably, the detection electrodes of the cover are also arranged in such a way that the capacitive coupling between the individual detection electrodes and the user's finger or stylus also varies substantially without jumps as the finger or stylus moves continuously (e.g. at constant speed) over the operating surface.

According to a preferred embodiment of the invention, the main line of extension of the input area and the resistive trace form a closed geometrical line (e.g. a rectangle, a circle, an ellipse or the like). If there are at least two terminals, the locations where the at least two terminals contact the resistive trace, respectively, are disposed at intervals (preferably regular ones) along the resistive trace.

According to another preferred embodiment of the invention, the main line of extension of the input area and the resistive trace form an open straight or curved line with a first end and a second end. If there is a single terminal, it preferably contacts the resistive trace either at the first or the second end, so that when a detection electrode is brought into contact with the resistive trace, the resistance measured between that detection electrode and the terminal indicates the distance between the point of contact and the end of the resistive trace. If there are at least two terminals contacting the resistive trace, at least two of these are preferably disposed at the first and second ends of the resistive trace, respectively. By applying a potential gradient between the terminals at the first and second ends, through the resistive trace, and measuring the voltage that results on a detection electrode when is put into contact with the resistive trace, one can determine the point where the electrical contact occurred on the resistive trace.

Those skilled will appreciate that the minimum force or pressure for establishing an initial contact between the detection electrodes and the resistive trace depends on various parameters, such as e.g. the geometry of the input area (width, length, shape, etc.), the configuration of the spacer or spacers that mount the cover on the support element (in terms of compressibility, height, etc.), as well as the configuration of the cover. For a given geometry and spacer arrangement, the rigidity of the cover is preferably chosen such that the initial contact between the detection electrodes and the resistive trace is established for a load comprised in the range from 50-500 g (corresponding to about 0.5-5 N), more preferably in the range from 100-500 g, and still more preferably in the range from 100-300 g. Those skilled will appreciate that this "hard touch threshold" lies well above the loads that need to be applied for the capacitive sensing. Indeed, reliable capacitive detection of the user's finger or stylus is possible even when the user holds the finger immediately above the operating surface. Typically, the user of a touchpad applies a load in the range from 5-20 g, which is sufficient for obtaining a certain tactile feedback when operating the touchpad. The above hard touch threshold being well above these values, unintentionally exceeding the hard touch threshold is seldom.

According to a preferred embodiment of the invention, at least one of the resistive traces and the set of detection electrodes comprises a pressure-sensitive layer arranged thereon in facing relationship with the other one of resistive trace and the set of detection electrodes. Those skilled will note that the presence of a pressure-sensitive layer (i.e. a layer whose transversal resistance gradually decreases when pressure applied thereon increases) makes it possible to determine also the amount of pressure the user exerts on the input area.

The touchpad preferably comprises a detection circuit configured and arranged for operating in a first and a second mode of detection, the first mode of detection being associated to the capacitive measurement and the second mode of detection being associated to the resistive measurement. While in the first mode of detection, the detection circuit measures quantities indicative of capacitive coupling between the detection electrodes and a user's finger or stylus and outputs the position of a user's finger or stylus based upon these quantities. While in the second mode of detection, the detection circuit measures quantities indicative of resistive coupling between the detection electrodes and the at least two terminals and outputs the position of a user's finger or stylus based upon the quantities indicative of resistive coupling. For the purposes of the present, a "quantity indicative of capacitive coupling" can be any measurable physical quantity that is linked to the capacitance between an individual one of the detection electrodes and the user's finger or stylus or between a pair of (preferably adjacent) detection electrodes, via the user's finger or stylus. Furthermore, for the purposes of the present, a "quantity indicative of resistive coupling" can be any measurable physical quantity that is linked to the resistance between an individual one of the detection electrodes and an individual one of the terminals contacting the resistive trace. The term "resistive coupling" has been chosen mainly for symmetry reasons, in order to summarise the fact that in the second mode of detection, the detection circuit measures parameters of possible resistive current paths between the detection electrodes and the terminals contacting the resistive trace.

The detection circuit might operate as follows. When operating in the first mode of detection reveals that one or more of the detection electrodes are in contact with the resistive trace, the detection circuit switches to the second mode of operation and determines the position of the activation by the resistive measurements. When operating in the second mode of detection reveals that there is no contact between the detection electrodes and the resistive trace, the detection circuit switches to the first mode of detection and determines the position of the activation by the capacitive measurements. If the detection circuit is so implemented that it cannot determine, while in the first mode of detection, whether the detection electrodes are in contact with the resistive trace or not, the detection circuit may periodically be switched to the second mode of detection to check this. Unless this check reveals that there is indeed a contact, the first mode of detection may be resumed.

More preferably, the detection circuit cyclically carries out the steps of detecting whether the cover is depressed or not; if it is detected that the cover is not depressed, switching to the first detection mode; if it is detected that the cover is depressed, switching to the second detection mode and outputting the position determined and an indication whether the position determined in the first detection mode or in the second detection mode.

Preferably, the detection circuit outputs, while in operation, a status flag indicating whether a currently outputted position of a user's finger or stylus is based on quantities indicative of capacitive coupling or on quantities indicative of resistive coupling. This is advantageous, in particular, if the detection circuit outputs the position information over a channel common to both the capacitive and the resistive measurements. Such a status flag may be any kind of signal understandable by an electronic appliance of which the touchpad may be a component or which the touchpad may communicate with. The status flag may, for instance be provided over a wire or lead separate from the wire(s) or lead(s) used for outputting the position information. Alternatively, when such flag is transmitted over the same wire(s) or lead(s) as the position information, each individual piece of position information may comprise its individual flag indicating the origin of the position information.

Alternatively, the detection circuit could have two (physical or virtual) channels for outputting the "capacitive" position information and the "resistive" position information, respectively. It may then be up to the electronic appliance in communication with the touchpad to determine which information is currently meaningful.

An electronic appliance (e.g. a laptop computer, a cellular phone, a media player, a household appliance, a car appliance, a navigation system, etc.) comprising a touchpad according to the present invention is preferably configured and arranged for operating in a first and a second input modes causing different responses of the electronic appliance to the position of a user's finger or stylus outputted by the detection circuit. Whether the first or the second input mode is active depends on whether at least one of the detection electrodes is in contact with the resistive trace or not. In the first input mode, the electronic appliance is responsive to the position of a user's finger or stylus outputted by the detection circuit based upon the quantities indicative of capacitive coupling, whereas, in the second input mode, the electronic appliance is responsive to the position of a user's finger or stylus outputted by the detection circuit based upon the quantities indicative of resistive coupling. Those skilled will appreciate that various responses of the electronic appliance may be associated to the different input modes. Preferably, if the electronic appliance comprises a display screen and a display controller for controlling the display screen, the display controller indicates on the display screen whether the electronic appliance is in the first or the second input mode. For instance, the appearance of a cursor may vary according to the input mode, a visual control element may appear, etc.

Advantageously, the first input mode may comprise at least one of a pointing mode and a scrolling mode, and wherein the second input mode comprises at least one of a selecting mode and a drag-and-drop mode. Those skilled will appreciate that the invention is especially useful in an electronic appliance in which the touchpad and the display are separate, e.g. in a laptop computer. Indeed, when using such appliances, the operator often has to first move the cursor or visual indicator to the desired location, before he can choose another action by clicking a button or tapping. If the touchpad according to the present invention is used, the operator may move the cursor or visual indicator by lightly touching the operating surface and moving the finger thereon. When the cursor is in the desired location, the second action may be initiated by depressing the cover of the touchpad. Drag-dropping may be considerably simplified since appliance can be so configured that the operator may move a selected item to another location by keeping the cover depressed when moving his or her finger or stylus.

Of course, the touchpad of the present invention may be used as the touch-sensitive input device of a touch-screen. However, since on a touchscreen it is normally not necessary to move a cursor to an item to be selected (instead, the operator directly puts his or her finger or stylus to the desired location), the provision of two different input modes may be less useful, in general, than in the case the touchpad and the display screen are separate
from one another. Notwithstanding that, there might be touch-screen applications, where the touchpad of the present invention would be greatly appreciated.

If the electronic appliance comprises an audio output and an audio controller for converting audio files into audio signals for the audio output, the first input mode preferably comprises one of (a) a volume adjustment mode for enabling a user of adjusting a sound volume by moving his/her finder or stylus and (b) a search mode for moving forward or backward through the audio files, whereas the second input mode comprises the other one of the volume adjustment mode and the search mode.

As shall be appreciated, the support element, the cover, the one or more spacers, the detection electrodes, the resistive trace, the terminals and/or any other components of the touchpad discussed herein may be made of or comprise parts of transparent, semi-transparent or translucent material(s), in such a way that the touchpad may be back-illuminated and/or positioned on top of a display screen.

BRIEF DESCRIPTION OF THE DRAWINGS

Further details and advantages of the present invention will be apparent from the following detailed description of several not limiting embodiments with reference to the attached drawings, wherein.

DETAILED DESCRIPTION

Figure 1:
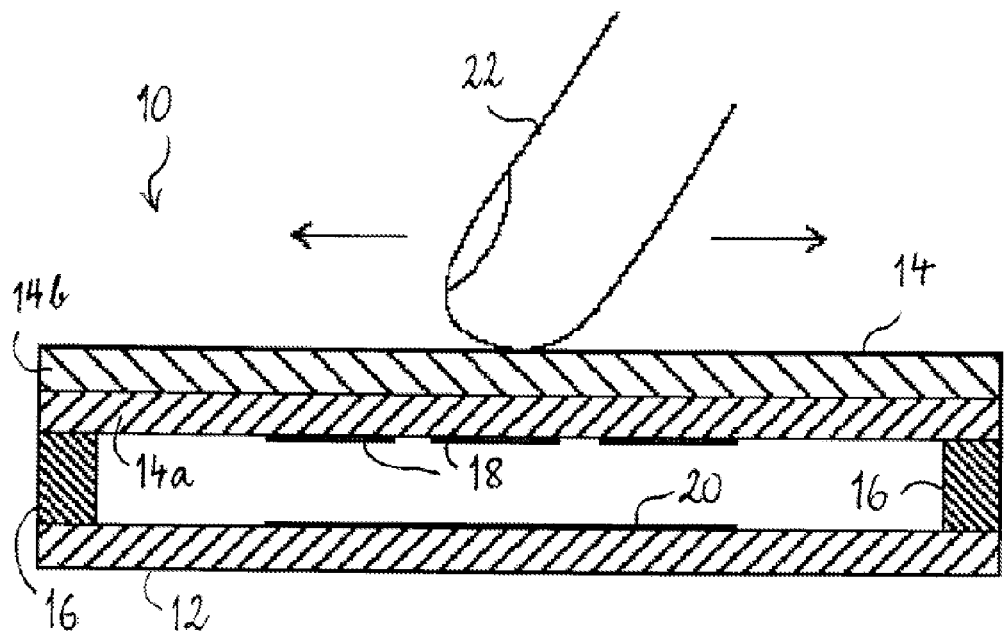
FIG. 1 is a first cross-sectional view of a linear touchpad on which a user moves his or her finger on the operating surface while exerting only little pressure.

Touchpad 10 of FIGS. 1 to 4 is configured for detecting the position of a user's finger or stylus in a single dimension. The touchpad 10 has an elongated input area with a main line of extension, which defines the dimension along which the user may move his or her finger or stylus and in which the position is detected. The touchpad 10 comprises a support element 12, a cover plate 14 and a spacer 16 delimiting the input zone, in which the cover plate 14 spans over the support element 12. The support element 12 is shown here as a mechanically rigid insulating plate but those skilled will appreciate that the support element more preferably comprises a mechanically rigid base plate having an insulating substrate, such as a film or a sheet, applied on the side facing the cover plate 14. The cover plate 14 comprises an insulating substrate 14a and a protective layer 14b applied to the surface of the substrate 14a that faces toward the operator. The protective layer 14b is made of a wear-resistant material on which the user's finger may glide easily without sticking. Detection electrodes 18 are arranged on the surface of the substrate 14a facing the support plate 12. The detection electrodes 18 are electrically insulated from one another and are disposed along the main line of extension of the input area of the touchpad. A resistive trace 20 (shown in FIGS. 1 to 4 as a continuous resistive strip) is arranged on the surface of the support plate in facing relationship with the detection electrodes 18.

Each one of FIGS. 5 to 8 shows, a sketch of the user's input according to FIGS. 1 to 4, respectively, the corresponding position calculated based upon the capacitive measurement, the corresponding position calculated based upon the resistive measurement and an example of an associated action on a display screen of an electronic appliance.

When the user brings his or her finger 22 into close proximity with or in light touch with the operating surface, the touchpad measures the capacitive coupling of the individual detection electrodes with the finger 22 and evaluates these measurements so as to derive the position of the finger 22 with respect to the detection electrodes. As the user moves his or her finger 22 on the operating surface along the main line of extension of the input area 24 while exerting no or little force (e.g. below 50 g) onto the cover plate 14 (FIGS. 1 and 5), the capacitive coupling between the detection electrodes and the finger changes accordingly and the position 26 calculated based on the capacitive measurement, output by the touchpad 10, varies accordingly. As long as there is no electrical contact between the detection electrodes 18 and the resistive trace 20, any resistive determination of the position of the finger does not provide a meaningful result. In FIGS. 5 to 8, undefined values of position are illustrated as "X". In the application example, moving of the finger 22 while exerting little or no force on the cover plate is associated with moving a pointer 28 through a list of items 30.

Figure 2:
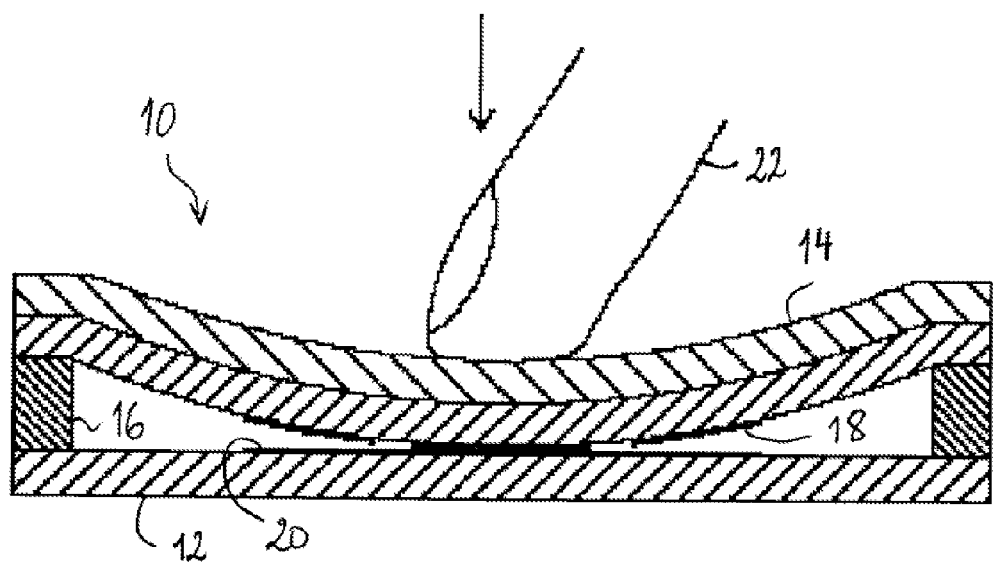
FIG. 2 is another cross-sectional view of the touchpad of FIG. 1, when the user depressed the cover of the touchpad with his or her finger.
Figure 3:
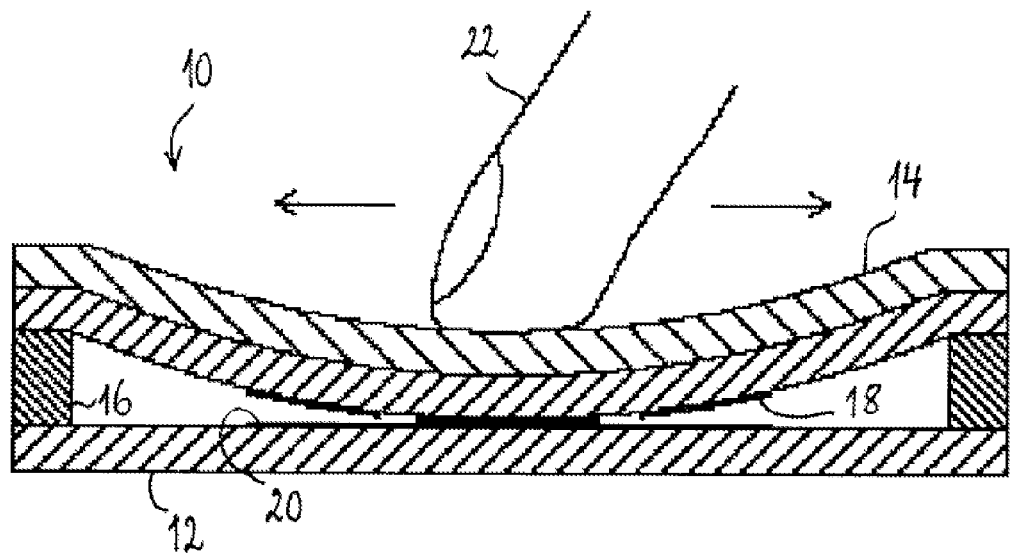
FIG. 3 is a further cross-sectional view of the touchpad of FIG. 1, when the user moves his or her finger while keeping the cover of the touchpad depressed.
Figure 4:
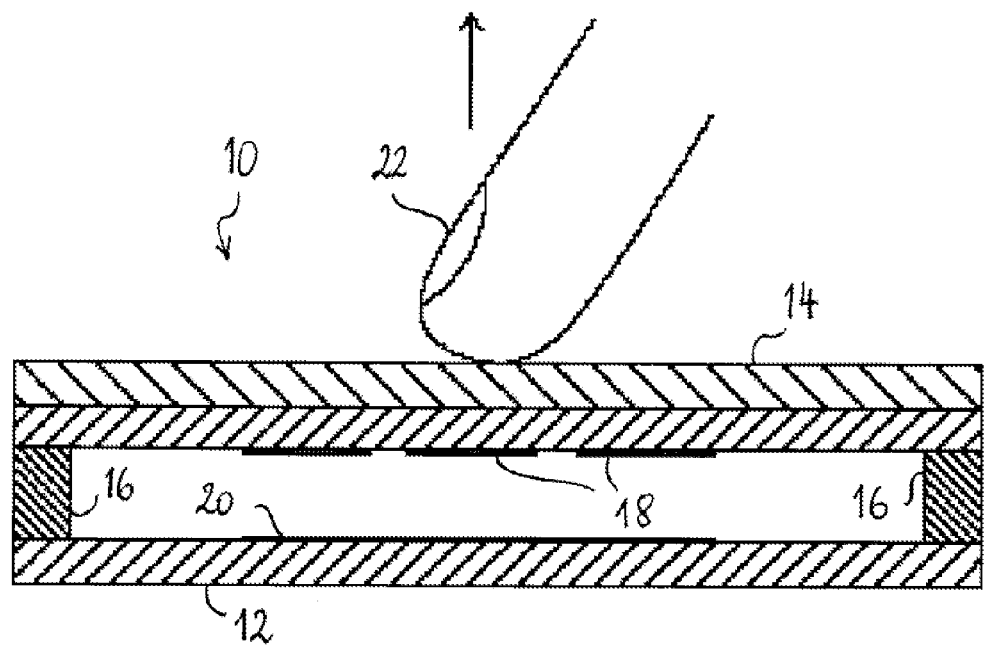
FIG. 4 is yet a further cross-sectional view of the touchpad of FIG. 1, when the user lifts his or her finger and releases the pressure on the cover.
Figure 5:
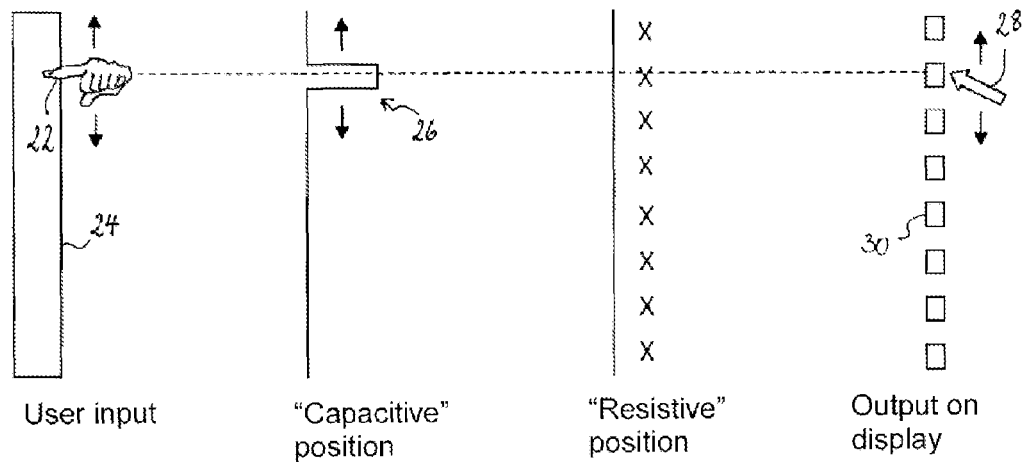
FIG. 5 is a schematic illustration of the operation of a linear touchpad in the situation of FIG. 1.
Figure 6:
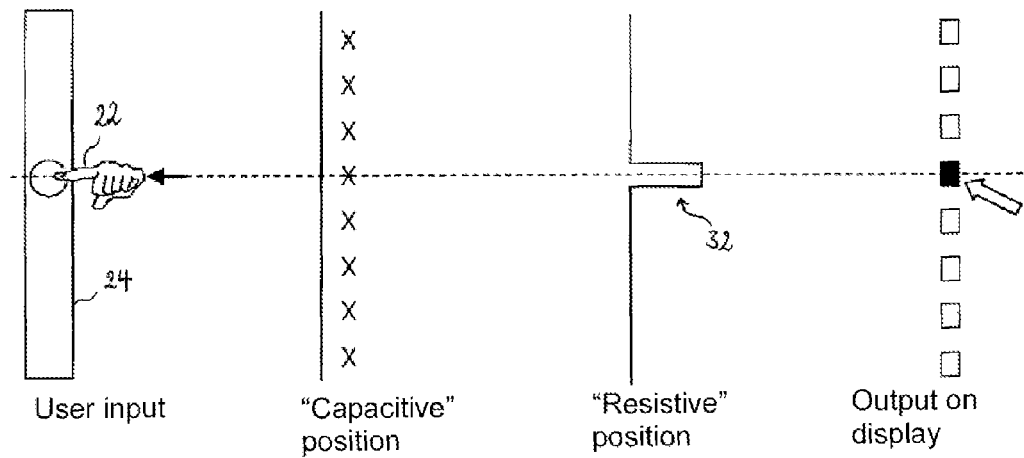
FIG. 6 is a schematic illustration of the operation of a linear touchpad in the situation of FIG. 2.
Figure 7:
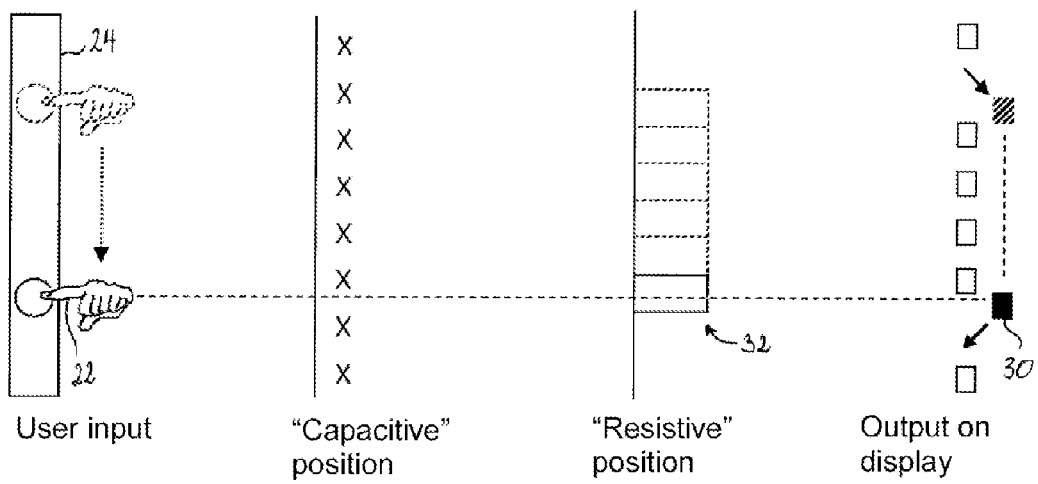
FIG. 7 is a schematic illustration of the operation of a linear touchpad in the situation of FIG. 3.
Figure 8:
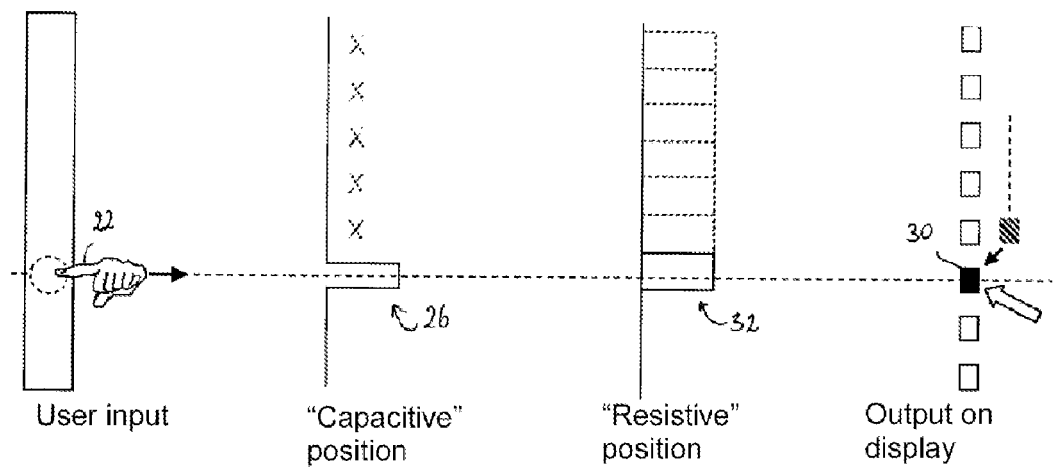
FIG. 8 is a schematic illustration of the operation of a linear touchpad in the situation of FIG. 4.
Figure 9:
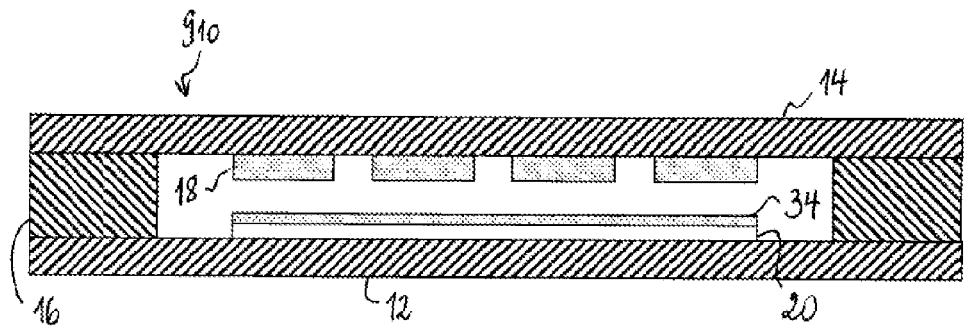
FIGS. 9 to 12 are cross-sectional views of various embodiments of a touchpad comprising an additional pressure-sensitive layer.
Figure 10:
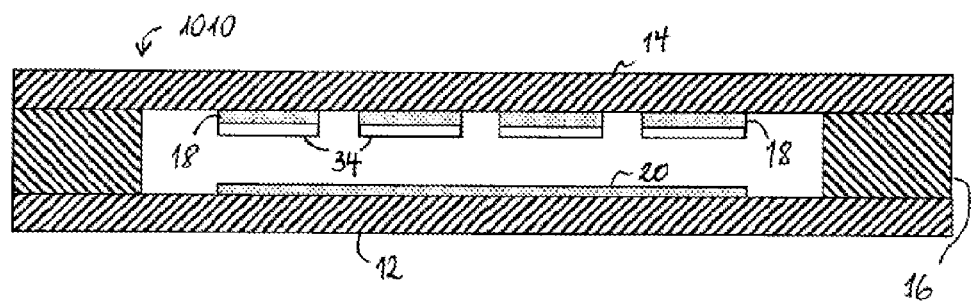

As the user increases the pressure on the cover plate 14, the latter eventually bends and is depressed onto the support plate 12, whereby one or
more of the detection electrodes 18 come into electrical contact with the resistive trace 20 (FIGS. 2 and 6). The rigidity of the cover plate 14, the geometry of the input area and the configuration of the spacer are adjusted to one another in such a way that the minimum load that a user has to apply to the cover plate 14 in order to establish the contact between the detection electrodes 18 and the resistive trace lies well above the force that they have to apply in order to have the tactile feedback of having his or her finger in light touch with the cover plate. The latter force may be slightly, user-dependent but is normally comprised in the range between 5 and 2O g, possibly up to 3O g. Accordingly, the minimum load for contact amounts preferably to about 100 g or more. Too high a minimum load for contact should not be used since this would result in uncomfortable operation of the touchpad. When the detection electrodes 18 and the resistive trace are in contact, the position of the point of application of the force is detected by resistive measurement(s), which results in an output position 32. A possibility of such measurement would comprise applying a potential gradient through the resistive trace 20, and then measure the resulting voltages on the detection electrodes. The measured voltage then indicates the position of the point of application of the force. As illustrated in FIG. 6, the capacitive determination of the position does not provide a meaningful output. In the application example, depressing the cover plate 14 and bringing the detection electrodes in contact with the resistive trace is associated with selecting the item 30 that the pointer 28 is currently pointing at.

As the user then moves his or her finger 22 along the input area while keeping the cover plate 14 depressed (FIGS. 3 and 7) the change in position is reflected by the resistive measurement. In the application example, this action is associated to dragging the selected item 30 through the list.

When the user lifts his finger 22 (FIGS. 4 and 8), the cover plate 14 returns to its rest position and the electrical contact between the detection electrodes and the resistive trace is interrupted. The touchpad then reverts to the capacitive measurement for detecting the position of the user's finger 22. In the application example, this action is associated to dropping the selected item 30 at the location it has been dragged to.

Figure 11:
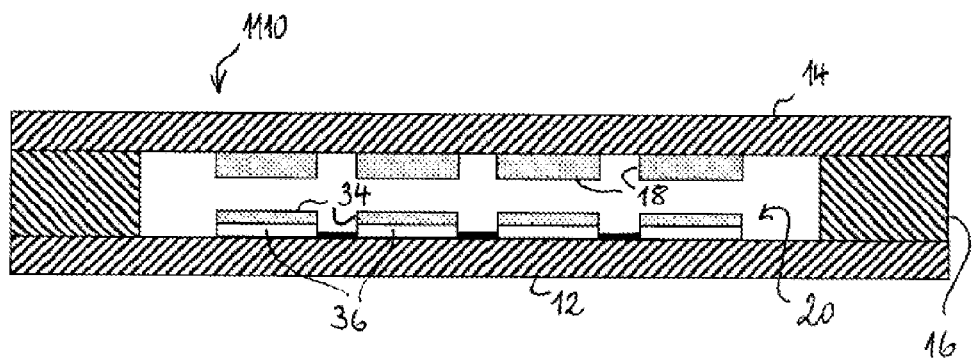
Figure 12:
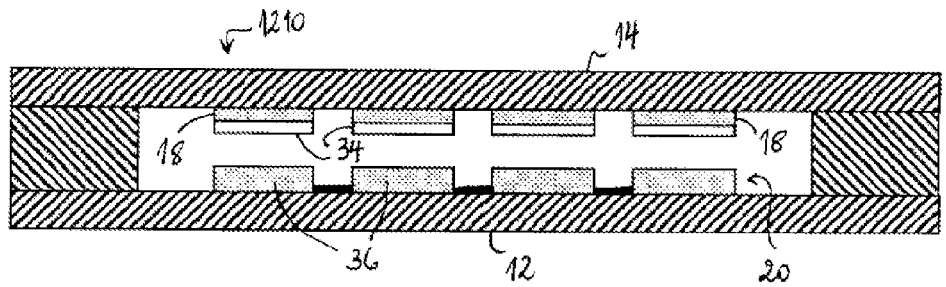

FIGS. 9 to 12 show various touchpad embodiments comprising a pressure-sensitive layer applied on the detection electrodes. Touchpad 910 of FIG. 9 has the additional pressure-sensitive layer 34 applied on the resistive trace 20. Touchpad 1010 of FIG. 10, in contrast, has the pressure-sensitive layer 34 applied as individual patches on the detection electrodes 18. FIG. 11 shows a touchpad 1110 whose resistive trace comprises a plurality of resistive elements 36 conductively interconnected in series. The pressure-sensitive layer 34 is provided as individual patches applied on the resistive elements 36. FIG. 12 shows a touchpad 1210, in which the pressure-sensitive layer 34 is applied as individual patches on the detection electrodes 18. The resistive trace 20 comprises a plurality of resistive elements 36 conductively interconnected in series. It shall be noted that the number of resistive elements 36 forming the resistive trace 20 need not necessarily correspond to the number of detection electrodes. Moreover, in order to avoid sudden jumps in the resistively computed position, the conductive interconnections between the resistive elements are preferably substantially shorter than the typical size of the contact area between the cover plate 14 and the support plate 12 when the user depresses the cover plate 14 for initiating the action associated to the resistive detection mode.

Figure 13:
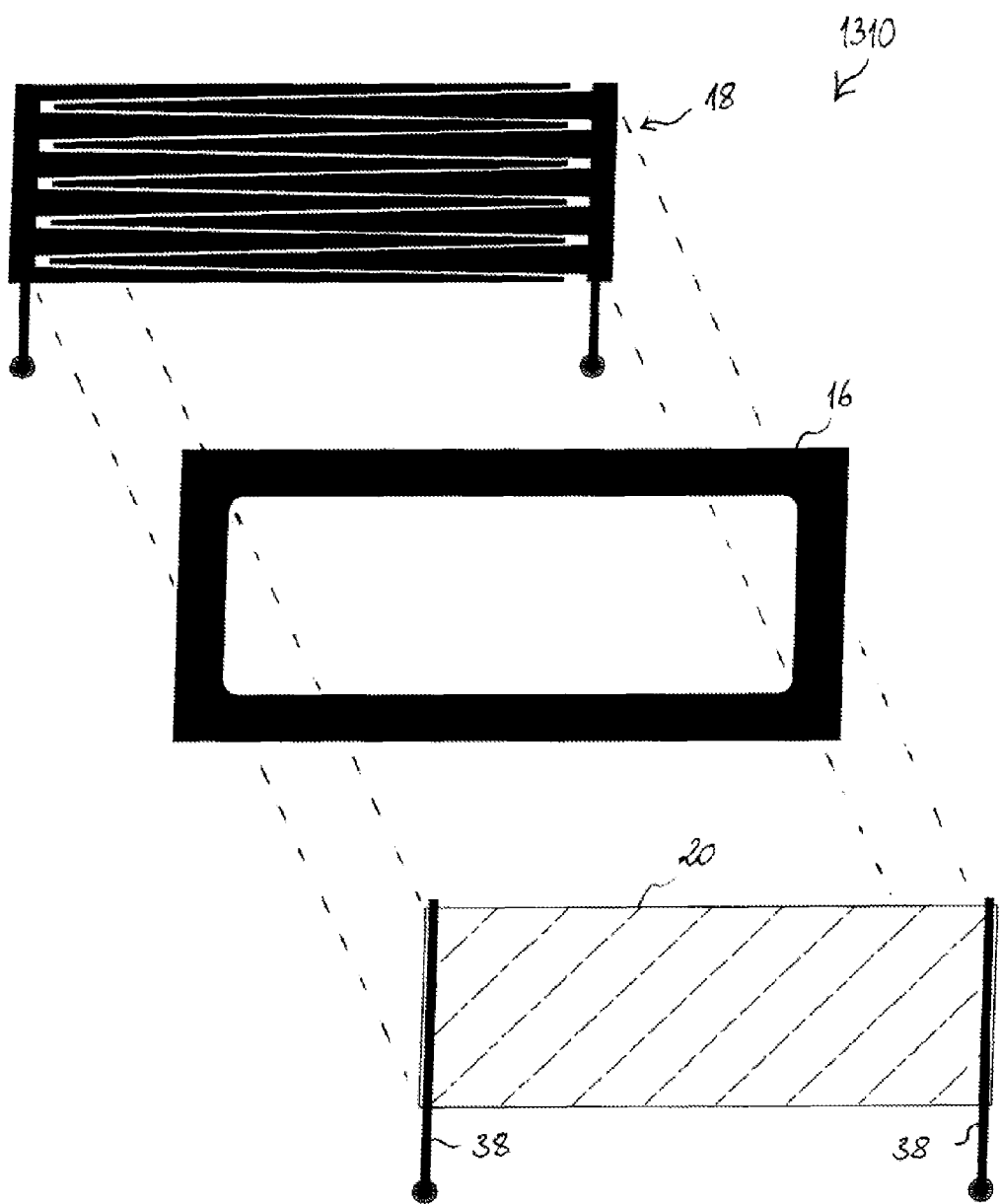
FIG. 13 is a partial exploded perspective view of a preferred embodiment of a linear touchpad.

FIG. 13 shows a partial exploded perspective view of a linear touchpad 1310. Touchpad 1310 has an elongated rectangular input area. The detection electrodes on the cover plate (not shown in FIG. 13) are provided as two interdigitated detection electrodes 18 linearly disposed such that the finger portions of one detection electrode are between the finger portions of the other detection electrode. The finger portions extend along the main line of extension of the input area, that is to say, in this case, essentially parallel to the longer side of the rectangle formed by the input area. As can be appreciated, the finger portions linearly taper from one narrow side of the rectangle, where the finger portions are conductively interconnected, to the other narrow side of the rectangle, where the finger portions of the other detection electrode are conductively interconnected.

When the user's finger (or stylus) is in proximity with the interdigitated detection electrodes (e.g. lightly touches the cover plate), the detection electrodes 18 capacitively couple to the finger or stylus. The capacitance of the capacitor formed by a detection electrode 18 and the finger or stylus depends on how much of the area of the detection electrode is in close vicinity of the finger or stylus. Accordingly, if the user moves his or her finger to the left (in FIG. 13) the capacitance of the left detection electrode will increase while the capacitance of the right detection electrode will decrease, due to the shape of the interdigitated fingers. Conversely, if the user moves his or her finger to the right the capacitance of the left detection electrode will decrease while the capacitance of the right detection electrode will increase. The position of the finger or stylus may thus be determined based upon the capacitance measurements for both of the detection electrodes 18.

The spacer 16 of the touchpad 1310 extends circumferentially around the input area, in such a way that a small gap is provided between the detection electrodes 18 and the resistive trace 20 on the support plate (not shown in FIG. 13). The resistive trace 20 has substantially the same shape as the input area. Two terminals contact the resistive trace at the diametrically opposed narrow sides thereof.

When the position of the point of application of a force is to be determined, a potential gradient is applied through the resistive trace 20 by means of the terminals 38. In other words, one of the terminals is brought to a first potential (e.g. 5 V or 12 V) and the other terminal is brought to a second potential (e.g. ground), different from the first potential. If the detection electrodes 18 of the cover plate are locally brought into electrical contact with the resistive trace, the voltage thus resulting one or both of the detection electrodes 18 indicates where the contact occurred.

Figure 14:
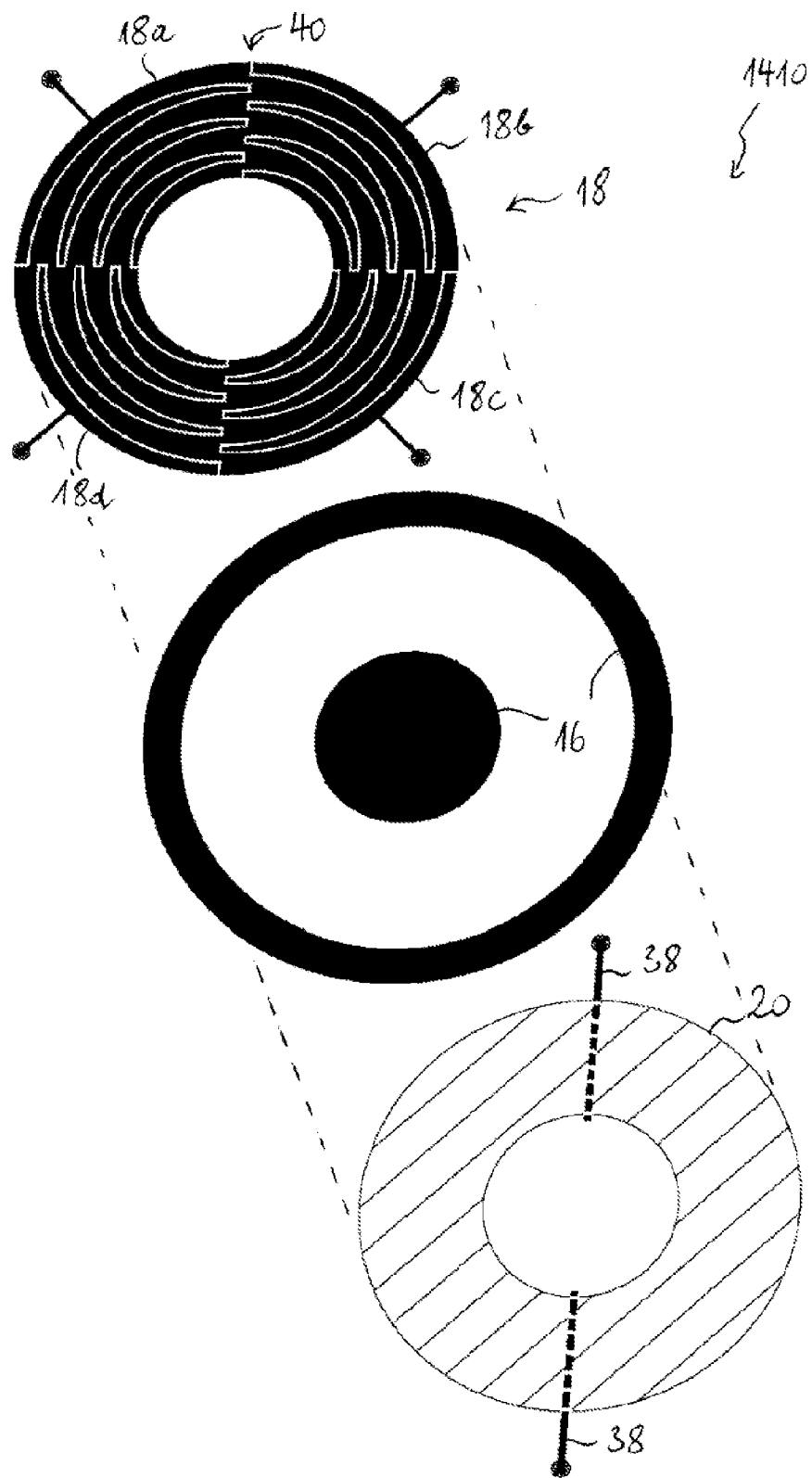
FIG. 14 is a partial exploded perspective view of a first preferred embodiment of a circular touchpad.
Figure 15:
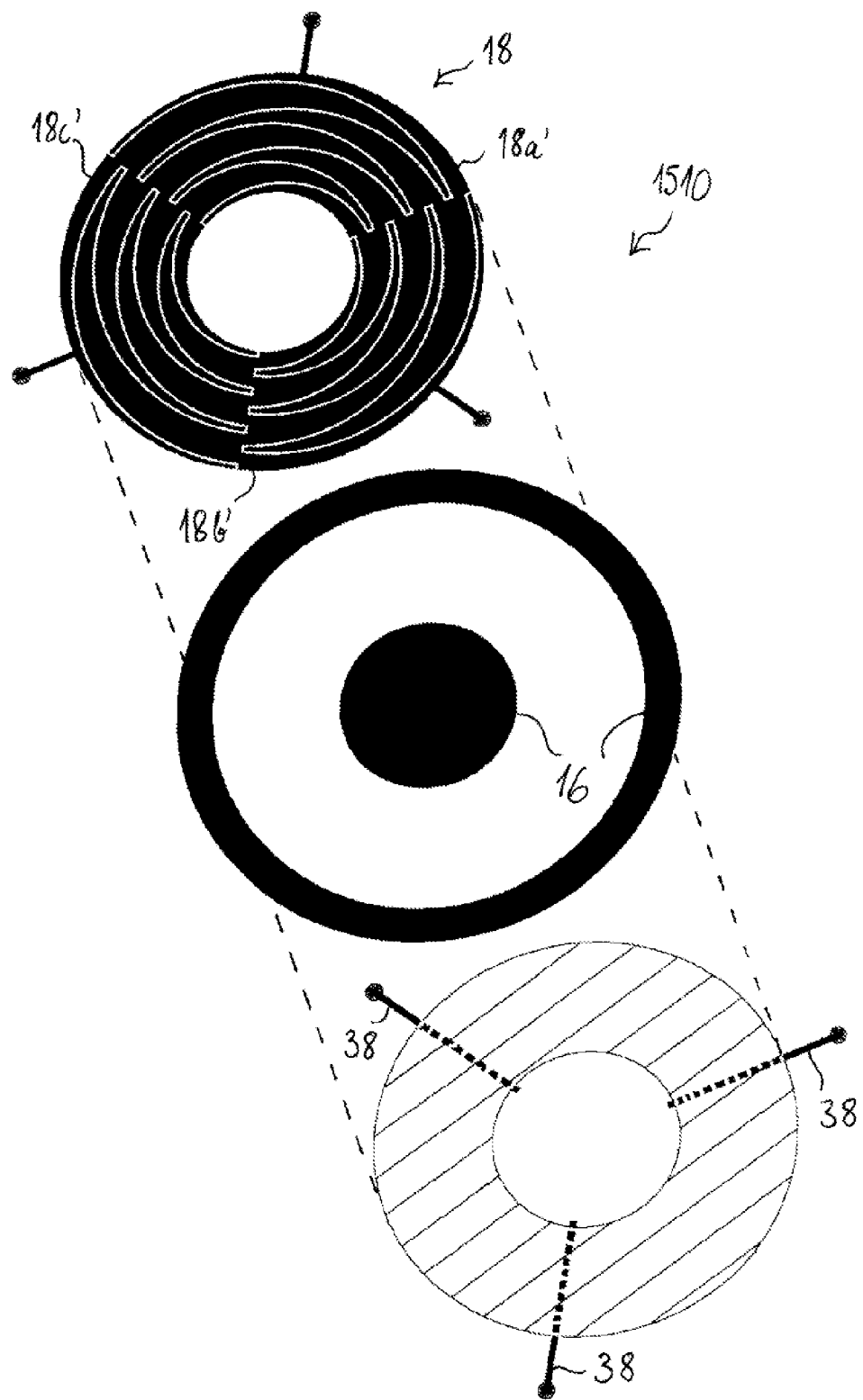
FIG. 15 is a partial exploded perspective view of a second preferred embodiment of a circular touchpad.

FIGS. 14 and 15 show partial exploded perspective views of a first and a second variant of a circular touchpad, respectively. A plurality of M interdigitated detection electrodes (in FIG. 14, M=4; in FIG. 15, M=3) are positioned in annular fashion about a central point, each detection electrode being insulated from the others. Each detection electrode includes a plurality of tapered, arcuate finger portions, extending in one or the other direction about the annulus, from the centre line, respectively, of each detection electrode. These centre lines (which extend substantially radially from the central point of the arrangement) are spaced with substantially equal angular separation, of about 360/M degrees, about the annulus. The fingers of any detection electrode 18 extend toward the centre lines of the adjacent detection electrodes and the angular extent of each detection electrode is thus 2*360/M degrees.

Each of the detection electrodes 18 has a separate electrical lead, respectively, extending therefrom to circuitry for detecting a change in capacitance between the detection electrodes 18 and a user's finger or stylus. Most preferably, the electrical leads between the detection electrodes and the detection circuit are shielded, so that the capacitance of the leads remains essentially constant and is not affected by the proximity of the user's finger or stylus. Shielding may be necessary, in particular, if the leads run in proximity to the input area.

The spacer 20 of the touchpads 1410 and 1510 comprises a radially inner portion and a radially outer portion delimiting therebetween an opening, which, itself defines the regions where the detection electrodes 18 may be brought into contact with the annular resistive trace 20 disposed on the support plate (not shown in FIG. 14).

In the embodiment illustrated in FIG. 14, the annulus has the centre line 40 of detection electrode 18a in the upwardly-vertical position, at "12 o'clock", and, therefore, has the remaining three centre lines positioned at the "3 o'clock" (detection electrode 18b), "6 o'clock" (detection electrode 18c) and "9 o'clock" (detection electrode 18d) positions, respectively. Each centre line has four tapering finger portions extending counter-clockwise therefrom and three tapering finger portions extending clockwise therefrom.

The terminals 38, contacting the resistive trace, are disposed between the support element and the resistive trace at diametrically opposed positions about the annulus. It is important to note that both terminals are arranged underneath two of the centre lines of the detection electrodes 18 on the cover. The point of contact between the detection electrodes 18 on the cover and the resistive trace 20 is determined by applying different voltages to the terminals 18 and measuring the resulting voltages on those detection electrodes that extend between the angular positions defined by the terminals 38. In FIG. 14, the terminals are located at the "12 o'clock" and the "6 o'clock" positions, so the voltage is measured on detection electrodes 18b and 18d. If the contact occurred in the angular range starting at "12 o'clock" in the clockwise sense and stopping at "6 o'clock", a defined voltage can be read at detection electrode 18b, while the voltage on detection electrode 18d is undefined. Conversely, if the contact occurred in the angular range starting at "6 o'clock" in the clockwise sense and stopping at "12 o'clock", a defined voltage can be read at detection electrode 18d, while the voltage on detection electrode 18b is undefined. The voltage measurements on both detection electrodes 18b and 18d have to be carried out in order to determine in which one of the angular segments the contact occurred.

In the embodiment illustrated in FIG. 15, the annulus has the centre line 40 of detection electrode 18b' in the "6 o'clock" position, and, therefore, has the remaining two centre lines positioned in the "2 o'clock" (detection electrode 18a') and "10 o'clock" (detection electrode 18c') positions, respectively. Each centre line has four tapering finger portions extending counter-clockwise therefrom and three tapering finger portions extending clockwise therefrom.

The touchpad 1510 comprises three terminals 38 that contact the resistive trace 20 at regular intervals about the annulus, between the support element and the resistive trace, in the "6 o'clock", "2 o'clock" and "10 o'clock" positions, respectively. The position of a point of contact between the detection electrodes 18 on the cover and the resistive trace is determined by applying different voltages to two of the terminals 38, and measuring the resulting voltages on the detection electrode 18 that covers the 240°-segment between the two concerned terminals 38. If the voltage on that detection electrode is not defined, the voltage on at least one of the other detection electrodes is measured to determine whether and where the activation occurred in the 120° segment between the concerned terminals.

The invention claimed is:

1. A touchpad with a strip-shaped input area having a straight or curved main line of extension, said touchpad comprising
   a support element
   a cover having a first surface facing away from said support element and a second surface facing towards said support element, said cover being arranged in spaced relationship with respect to said support element in such a way that said cover spans over said support plate in said input area, said cover being depressible towards said support element by a force acting on the input area of said touchpad;
   a resistive trace arranged on said support element, said resistive trace extending along the main line of extension of said input area,
   at least one terminal contacting said resistive trace at a particular point of the main line of extension of said input area,
   a set of detection electrodes arranged on the second surface of the cover in facing relationship with said resistive trace, said detection electrodes being configured and arranged to capacitively detect a position of a user's finger or stylus when the user's finger or stylus is in proximity of or in light touch with the first surface of said cover, and to resistively detect a position of a user's finger or stylus when the user's finger or stylus depresses said cover and so brings at least one of said detection electrodes into electrical contact with said resistive trace
   a detection circuit configured and arranged to operate in a first and a second mode of detection,
   wherein said detection circuit
   while in said first mode of detection, determines quantities indicative of capacitive coupling between said detection electrodes and a user's finger or stylus and outputs the position of a user's finger or stylus based upon said quantities indicative of capacitive coupling; and
   while in said second mode of detection, determines quantities indicative of resistive coupling between said detection electrodes and said at least one terminal and outputs the position of a user's finger or stylus based upon said quantities indicative of resistive coupling.

2. The touchpad as claimed in claim 1, wherein the main line of extension of said input area and said resistive trace form a closed geometrical line.

3. The touchpad as claimed in claim 2, comprising at least two terminals contacting said resistive trace, each one of said at least two terminals contacting said resistive trace at a particular point of the main line of extension of said input area, wherein the points where said at least two terminals contact said resistive trace are disposed at intervals along said resistive trace.

4. The touchpad as claimed in claim 1, wherein the main line of extension of said input area and said resistive trace form an open straight or curved line with a first end and a second end.

5. The touchpad as claimed in claim 4, comprising at least two terminals contacting said resistive trace, each one of said at least two terminals contacting said resistive trace at a particular point of the main line of extension of said input area, wherein the points where said at least two terminals contact said resistive trace are disposed at intervals along said resistive trace, and wherein at least two of said at least two terminals contacting said resistive trace are disposed at the first and second ends of said resistive trace, respectively.

6. The touchpad as claimed in claim 1, wherein said cover is chosen with a rigidity such that an initial contact between said detection electrodes and said resistive trace is established for a load comprised in the range from 50-500 g.

7. The touchpad as claimed in claim 1, wherein at least one of said resistive trace and said set of detection electrodes comprises a pressure-sensitive layer arranged thereon in facing relationship with the other one of said resistive trace said set of detection electrodes.

8. The touchpad as claimed in claim 1, wherein said detection circuit outputs, while in operation, a status flag indicating whether a currently outputted position of a user's finger or stylus is based on quantities indicative of capacitive coupling or on quantities indicative of resistive coupling.

9. An electronic appliance comprising a touchpad, with a strip-shaped input area having a straight or curved main line of extension,
   wherein said touchpad comprises
   a support element
   a cover having a first surface facing away from said support element and a second surface facing towards said support element, said cover being arranged in spaced relationship with respect to said support element in such a way that said cover spans over said support plate in said input area, said cover being depressible towards said support element by a force acting on the input area of said touchpad;

a resistive trace arranged on said support element, said resistive trace extending along the main line of extension of said input area;

at least one terminal contacting said resistive trace at a particular point of the main line of extension of said input area, a set of detection electrodes arranged on the second surface of the cover in facing relationship with said resistive trace, said detection electrodes being configured and arranged to capacitively detect a position of a user's finger or stylus when the user's finger or stylus is in proximity of or in light touch with the first surface of said cover, and to resistively detect a position of a user's finger or stylus when the user's finger or stylus depresses said cover and so brings at least one of said detection electrodes into electrical contact with said resistive trace;

a detection circuit configured and arranged to operate in a first and a second mode of detection, wherein said detection circuit while in said first mode of detection, determines quantities indicative of capacitive coupling between said detection electrodes and a user's finger or stylus and outputs the position of a user's finger or stylus based upon said quantities indicative of capacitive coupling; and while in said second mode of detection, determines quantities indicative of resistive coupling between said detection electrodes and said at least one terminal and outputs the position of a user's finger or stylus based upon said quantities indicative of resistive coupling;

wherein said electronic appliance is configured and arranged to operate either in a first or a second input mode, wherein, in said first input mode, said electronic appliance is responsive to the position of a user's finger or stylus outputted by said detection circuit based upon said quantities indicative of capacitive coupling, wherein, in said second input mode, said electronic appliance is responsive to the position of a user's finger or stylus outputted by said detection circuit based upon said quantities indicative of resistive coupling, and wherein the response of said electronic appliance to the position of a user's finger or stylus outputted by said detection circuit is different for the two input modes.

10. The electronic appliance as claimed in claim 9, wherein said detection circuit outputs, while in operation, a status flag indicating whether a currently outputted position of a user's finger or stylus is based on quantities indicative of capacitive coupling or on quantities indicative of resistive coupling.

11. The electronic appliance as claimed in claim 10, wherein said first input mode comprises at least one of a pointing mode and a scrolling mode, and wherein said second input mode comprises at least one of a selecting mode and a drag-and-drop mode.

12. The electronic appliance as claimed in claim 9, comprising a display screen and a display controller for controlling said display screen, wherein said display controller indicates on said display screen whether said electronic appliance is in said first or said second input mode.

13. The electronic appliance as claimed in claim 9, comprising an audio output and an audio controller for converting audio files into audio signals for said audio output, wherein said first input mode comprises one of a volume adjustment mode for enabling a user of adjusting a sound volume by moving his/her finder or stylus and a search mode for moving forward or backward through said audio files, and wherein said second input mode comprises the other one of said volume adjustment mode and said search mode.

* * * * *